United States Patent
Röhrer

(10) Patent No.: US 10,042,010 B2
(45) Date of Patent: Aug. 7, 2018

(54) HALL SENSOR AND SENSOR ARRANGEMENT

(71) Applicant: ams AG, Unterpremstätten (AT)

(72) Inventor: Georg Röhrer, Lebring (AT)

(73) Assignee: ams AG, Unterpremstaetten (AT)

( * ) Notice: Subject to any disclaimer, the term of this patent is extended or adjusted under 35 U.S.C. 154(b) by 117 days.

(21) Appl. No.: 14/374,521

(22) PCT Filed: Nov. 13, 2012

(86) PCT No.: PCT/EP2012/072503
§ 371 (c)(1),
(2) Date: Jul. 24, 2014

(87) PCT Pub. No.: WO2013/113418
PCT Pub. Date: Aug. 8, 2013

(65) Prior Publication Data
US 2014/0361766 A1     Dec. 11, 2014

(30) Foreign Application Priority Data
Feb. 1, 2012   (EP) .................................... 12153493

(51) Int. Cl.
*G01R 33/06*   (2006.01)
*G01R 33/07*   (2006.01)
*G01R 33/00*   (2006.01)

(52) U.S. Cl.
CPC ......... *G01R 33/07* (2013.01); *G01R 33/0094* (2013.01); *G01R 33/075* (2013.01); *G01R 33/077* (2013.01)

(58) Field of Classification Search
CPC .... G01R 33/06; G01R 33/07; G01R 33/0094; G01R 33/075; G01R 33/077; G01R 33/02; G01R 15/202
(Continued)

(56) References Cited

U.S. PATENT DOCUMENTS

| 2,942,177 A | 6/1960 | Neumann et al. |
| 2,987,669 A | 6/1961 | Kallmann |

(Continued)

FOREIGN PATENT DOCUMENTS

| CN | 101622539 A | 1/2010 |
| CN | 101802631 A | 8/2010 |

(Continued)

OTHER PUBLICATIONS

Maupin, et al., "The Hall Effect in Silicon Circuits", Springer Science+Business Media, 1980, New York.
(Continued)

*Primary Examiner* — Arleen M Vazquez
*Assistant Examiner* — Steven Yeninas
(74) *Attorney, Agent, or Firm* — McDermott Will & Emery LLP

(57) ABSTRACT

A Hall sensor (HS) comprises at least four sensor terminals (EXT_A, EXT_B, EXT_C, EXT_D) for connecting the Hall sensor (HS) in at least two Hall sensing elements (11, 12, ..., 44) connected together, element terminals (A, B, C, D) of the Hall sensing elements (11, 12, ..., 44) are connected in between the sensor terminals (EXT_A, EXT_B, EXT_C, EXT_D). Each of the Hall sensing elements (11, 12, ..., 44) is configured to provide an individual sensor value between two of its element terminals (A, B, C, D). The at least two Hall sensing elements (11, 12, ..., 44) are distributed basically equally into two halves ($B_1$, $B_2$) and are connected such that a difference value is electrically formed between two of the sensor terminals (EXT_A, EXT_B, EXT_C, EXT_D) resulting from the respective individual sensor values. The individual sensor values of one half ($B_1$) form a minuend of the difference value and the individual sensor values of the other half ($B_2$) form a subtrahend of the difference value such that the minuend and
(Continued)

Figure 1:
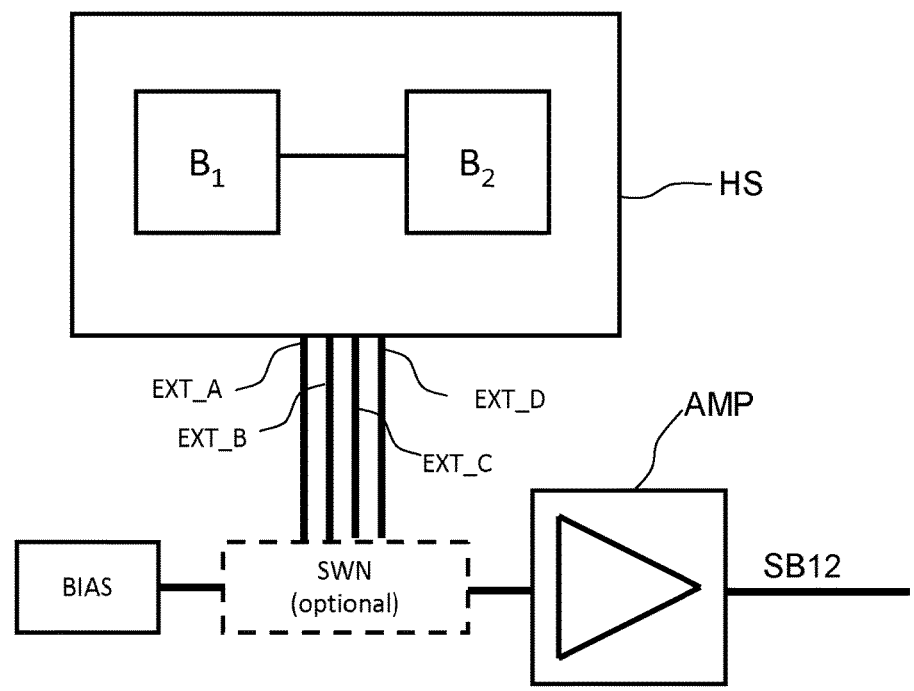

the subtrahend cancel out each other in case a homogeneous magnetic field of the same intensity and the same direction is applied to both halves ($B_1$, $B_2$).

21 Claims, 7 Drawing Sheets

(58) Field of Classification Search
USPC .... 324/251, 253, 227, 226, 225, 207.2, 202, 324/244, 247, 252, 260
See application file for complete search history.

(56) References Cited

U.S. PATENT DOCUMENTS

| | | | |
|---|---|---|---|
| 4,692,702 A * | 9/1987 | Huschelrath | G01N 27/82 324/235 |
| 4,737,710 A * | 4/1988 | Van Antwerp | G01D 5/147 324/207.2 |
| 5,084,674 A | 1/1992 | Lachmann et al. | |
| 5,241,270 A | 8/1993 | Ng | |
| 5,406,202 A | 4/1995 | Mehrgardt et al. | |
| 5,844,427 A | 12/1998 | Theus et al. | |
| 6,768,301 B1 | 7/2004 | Hohe et al. | |
| 7,345,476 B2 | 3/2008 | Middelhoek et al. | |
| 2007/0046287 A1* | 3/2007 | Vervaeke | G01R 33/0094 324/251 |
| 2009/0051351 A1* | 2/2009 | Forsyth | G01D 5/145 324/207.2 |
| 2010/0042336 A1* | 2/2010 | Lee | G01N 27/9006 702/38 |
| 2012/0001664 A1 | 1/2012 | Kume | |
| 2012/0016614 A1 | 1/2012 | Hohe et al. | |
| 2013/0021026 A1* | 1/2013 | Ausserlechner | G01L 1/12 324/251 |
| 2013/0127453 A1* | 5/2013 | Ausserlechner | G01R 33/07 324/251 |
| 2014/0009146 A1* | 1/2014 | Blagojevic | G01R 33/04 324/252 |
| 2014/0117983 A1 | 5/2014 | Rohrer | |

FOREIGN PATENT DOCUMENTS

| | | |
|---|---|---|
| CN | 201628764 U | 11/2010 |
| CN | 101983340 A | 3/2011 |
| CN | 102236042 A | 11/2011 |
| DE | 1194971 B | 6/1965 |
| DE | 4422868 A1 | 1/1996 |
| DE | 10 2006 037 226 A1 | 2/2008 |
| DE | 10 2011 017 096 A1 | 10/2012 |
| EP | 0363512 A1 | 4/1990 |
| EP | 0548391 A1 | 6/1993 |
| EP | 1654552 B1 | 10/2008 |
| EP | 2071347 A2 | 6/2009 |
| GB | 822210 A | 10/1959 |
| JP | 58154263 | 9/1983 |
| JP | 2005249679 A | 9/2005 |
| JP | 2007502965 A | 2/2007 |
| JP | 2008022022 A | 1/2008 |
| JP | 2010500536 A | 1/2010 |
| WO | WO-03/036733 A2 | 5/2003 |
| WO | WO-2005/017546 A1 | 2/2005 |
| WO | WO-2008017348 A2 | 2/2008 |

OTHER PUBLICATIONS

Peter Munter, "Spinning Current Method for Offset Reduction in Silicon Hall Plates", ISBN 90-6275-780-4/CIP, Jun. 16, 1992, Delft University Press.
Popovic, et al., "Integrated Hall-effet magnetic sensors", Department of Microengineering, EPFL, Swiss Federal Institute of Technology, CH-1015, 2001, Lausanne, Switzerland.
Zoran Randjelovic, "Low-power High Sensitivity Integrated Hall Magnetic Sensor Mircosystems", These No. 2198 (2000), EPFL, Lausanne, Switzerland.
Popovic, R.S.: "Hall Effect Devices", Second Edition, Institute of Physics Publishing, Bristol and Philadelphia, 2004, pp. 352-407.
Stahl-Offergeld, Markus: "Robust three-dimensional Hall sensors for multi-axis Position measurement systems", Dissertation, Saarbrücken, 2010, pp. 1-10.

* cited by examiner

Fig 11

Fig 12

HALL SENSOR AND SENSOR ARRANGEMENT

The invention relates to a Hall sensor with several Hall sensing elements, and to a sensor arrangement with such a Hall sensor.

The Hall Effect named after the American physicist Edwin Herbert Hall (1855-1938) occurs when a magnetic field is present perpendicular to an electric current. The magnetic field in this case generates a potential difference, which is called a Hall voltage, in a direction which is perpendicular to both the direction of the magnetic field as well as to the direction of the current. By measuring the Hall voltage it is possible to determine the size of the component of the magnetic field.

A Hall sensor for measuring a Hall voltage can be realized as a semiconductor device. In the semiconductor device an evaluation circuit can also be integrated, which for example is produced as a part of a CMOS process. If the plane of the active region, in which the operating current flows and in which the Hall voltage occurs, is located coplanar to the top of the semiconductor body, a Hall voltage can be measured, which is caused from a component of the magnetic field directed perpendicular to the top. If the plane of the active region is arranged perpendicular to the top, i.e. is vertical within the semiconductor body, a Hall voltage can be measured which is caused by a component of magnetic field being parallel to the top.

With Hall sensor semiconductor devices, an achievable sensitivity is limited by the mobility of charge carriers in the semiconductor material used. In silicon, the maximum sensitivity of a Hall sensor, measured by the size of the Hall voltage relative to the magnetic field strength and the operating voltage is around 0.1 V/T. Other semiconductor materials have a higher charge carrier mobility, but may be less suitable for an integration of the Hall sensor with the control and evaluation electronics.

In various applications, for example rotary encoders or current sensors, the difference of the magnetic field between two positions is measured. According to conventional arrangements, two Hall sensors with an amplification stage for each Hall sensor are used, wherein the difference of the outputs of the amplification stages is evaluated by digital or analog subtraction.

It is an object of the present invention to provide an improved concept for the evaluation of the difference of magnetic fields at different positions.

This object is achieved with the subject-matter of the independent claims. Developments and further embodiments are the subject-matter of the dependent claims.

The improved concept is based on the idea to provide a Hall sensor with at least two Hall sensing elements, which measure a magnetic field at different locations. The Hall sensing elements are connected together in such a way that a difference between individual sensor values is electrically formed while the Hall sensing elements may measure a magnetic field of the same orientation. Furthermore, the Hall sensing elements are connected in between sensor terminals of the Hall sensor. Hence, the Hall sensing elements are not connected directly to an evaluation circuit but over a reduced number of sensor terminals of the Hall sensor. Hence, an output signal of the Hall sensor, namely a difference value corresponding to the difference of the magnetic fields at the two locations, can be evaluated and amplified directly by a single amplification stage. In consequence, the improved concept results in less power consumption and reduced noise of the arrangement. The difference value is formed coinstantaneously or simultaneously for the two locations, hence, within one single measurement.

According to one embodiment, a Hall sensor comprises at least four sensor terminals for connecting the Hall sensor and at least two Hall sensing elements connected together, element terminals of the Hall sensing elements connected in between the sensor terminals. Each of the Hall sensing elements is configured to provide an individual sensor value between two of it element terminals. The at least two Hall sensing elements are distributed basically equally into two halves and are connected such that a difference value is electrically formed between two of the sensor terminals resulting from their respective individual sensor values. The individual sensor values of one half form a minuend of the difference value and the individual sensors values of the other half form a subtrahend of the difference value.

Hence, the individual sensor values of the Hall sensing elements of each half of the Hall sensing elements contributes to the resulting difference value between the two sensor terminals of the Hall sensor. For example, the two halves are arranged such that the minuend and the subtrahend cancel out each other in case a homogeneous magnetic field of the same intensity and the same direction is applied to both halves.

For example, the Hall sensor and the comprised Hall sensing elements are arranged on a semiconductor body. The Hall sensor is contacted via the sensor terminals, which may also be called external terminals. In contrast, the element terminals of the Hall sensing elements are not directly contactable, in particular not as a single contact, such that the element terminals may also be called internal terminals. In particular, the Hall sensor can be contacted and operated via the external terminals, or sensor terminals respectively, like a conventional Hall sensor. However, differing from a conventional Hall sensor, not an absolute magnetic field intensity is measured, but the difference of two magnetic field intensities.

For example, not all of the element terminals lead to respective external sensor terminals of the Hall sensor, but partially there is a connection of the element terminals only between the individual Hall sensing elements.

For example, two of the sensor terminals are used for supplying a power signal, such as a supply current of the Hall sensor, while two other sensor terminals are used for recording a measurement signal, namely the difference value, for example in the form of a difference voltage. In particular, the element terminals of the Hall sensing elements are usually not connected directly from the outside, but only via the respective sensor terminals. In other words, element terminals are defined by the fact that via these terminals no supply signal, e.g. a supply current, is provided to the Hall sensor. If some element terminals of Hall sensing elements are connected to terminals at the outside, these terminals are only then to be understood as sensor terminals, if these terminals are used for contacting the Hall sensor during operation, in particular at the operating time in a measurement operation. However, if such an element terminal, which is connected to the outside, is only used for internal purposes, for example a measurement within the Hall sensor, then such a terminal is to be understood as an additional auxiliary terminal of the Hall sensor.

The sensor terminals are functionally defined by the fact that the plurality of interconnected Hall sensing elements can be contacted via the sensor terminals like a single Hall sensor. In this respect, the sensor terminals differ from element terminals being connected to the outside optionally.

In particular, the sensor terminals are configured for contacting the Hall sensor during operation.

Preferably, all of the Hall sensing elements of the Hall sensor are constructed congenerously. The term "congenerous Hall sensing elements" is understood such that these have at least partially identical properties. For example, the Hall sensing elements have an equal number of element terminals and/or have the same geometric dimensions. However, in various embodiments, Hall sensing elements are interconnected, which are not constructed congenerously.

For example, the Hall sensing elements used within the Hall sensor are constructed as lateral Hall sensing elements, in particular Hall plates. Such Hall sensing elements measure a magnetic field orientated perpendicular to a surface of the Hall sensing element or the Hall plate respectively.

In other embodiments, the Hall sensing elements of the Hall sensor are constructed as vertical Hall sensing elements. Such Hall sensing elements measure a magnetic field orientated in parallel to a surface of the Hall sensing element. For example, the at least two Hall sensing elements are constructed as vertical Hall sensing elements, which measure a magnetic field of a different orientation parallel to the surface. Hence, for example a difference value can be formed of magnetic fields being perpendicular to each other while being parallel to the surface of the Hall sensing element. The individual sensor values may correspond to different coordinate axes in the plane of the surface.

However, also vertical and lateral Hall sensing elements can be combined within the Hall Sensor in various embodiments, wherein electrical parameters of the Hall sensing elements may be adapted to each other.

In some embodiments, exactly two Hall sensing elements are comprised by the Hall sensor, such that a difference value is formed between the two Hall sensing elements. In other embodiments, a greater number, preferably an even number, of Hall sensing elements is comprised by the Hall sensor wherein some of the Hall sensing elements provide a positive portion to the difference value and some provide a negative portion to the difference value. In any case, the Hall sensing elements of the Hall sensor can be separated into two basically equal parts.

According to one embodiment, the Hall sensing elements of the one half are arranged in a first contiguous area of the Hall sensor and the Hall sensing elements of the other half are arranged in a second contiguous area of the Hall sensor. The second contiguous area is preferably non-overlapping with the first contiguous area. Accordingly, a value for a magnetic field intensity at a first position is determined by the individual sensor values of the Hall sensing elements within the first area, for example a mean value within this first area. Similarly, the individual sensor values of the Hall sensing elements within the second area contribute to a value of the magnetic field intensity of a second position.

For example, the first contiguous area and the second contiguous area have a similar shape and arranged spaced apart. Hence, comparable contributions of the respective Hall sensing elements can be expected. The spacing between the areas may be determined by the specific application of the Hall sensor. For example, if the Hall sensor is to be used for a rotary encoder, the spacing may be based on a dimension of the magnet which is used for generating the magnetic field. If the Hall sensor is used for a current sensor, the spacing may be based on the distance of two coils which generate a magnetic field based on the current to be measured.

According to one embodiment, the at least two Hall sensing elements are connected in an anti-parallel fashion.

For example, if the Hall sensor comprises two Hall sensing elements, two element terminals of the Hall sensing terminals are connected with the same polarity such that, for example, a supply current flows through the Hall sensing elements in the same direction. The other two element terminals are connected with a polarity opposite to each other such that, for example, their voltage contribution is of opposite direction, thus forming a difference voltage. In particular, each sensor terminal of the Hall sensor is connected to exactly one of the element terminals of each Hall sensing element. Although explained for two Hall sensing elements, the principle can also be applied to a greater, preferably even, number of Hall sensing elements.

For example, the at least two Hall sensing elements each have a first, a second, a third and a fourth element terminal. At two of the element terminals, the at least two Hall sensing elements are connected in a direct connection fashion, and at two other of the element terminals the at least two Hall sensing elements are connected in a cross-connection fashion.

With the above-described connection of the Hall sensing elements within the Hall sensor, an input resistance of the Hall sensor is decreased compared to a conventional application with separate Hall sensors. Furthermore, for a given noise level, a current consumption during operation of the Hall sensor is decreased to the conventional application.

In some aspects of the above-described embodiments, one of the Hall sensing elements is arranged to be rotated with respect to another of the Hall sensing elements. Hence, the effects of an offset or a residual offset can be decreased.

In a further embodiment the at least two Hall sensing elements are connected in an anti-serial fashion. For example, if the Hall sensor comprises two Hall sensing elements of the same geometrical orientation, sensing terminals for measuring the individual sensor value, for example a Hall voltage, are connected in a serial fashion but with an opposite polarity, such that one Hall sensing element provides a positive contribution to the resulting difference, whereas the other Hall sensing element provides a negative contribution to a difference value. The remaining element terminals of the Hall sensing elements may be used for providing a supply signal to the Hall sensing elements, which can be performed individually for each Hall sensing element or with a common supply signal for all Hall sensing elements. Hence, the Hall sensor may comprise two sensor terminals for providing the resulting difference value and two or more sensor terminals for applying a supply signal.

The connection between the sensor terminals may be fixed. In order to be able to perform techniques like current spinning, the interconnections between the sensor terminals may be variable. For example, the element terminals of the Hall sensing elements are configured to be used as signal terminals or as supply terminals. The Hall sensor further comprises a switching network, which is configured to vary connections of the supply terminals to respective sensor terminals in consecutive operating phases and to vary connections of the signal terminals between the respective two sensor terminals in the consecutive operating phases, such that the difference value is electrically formed between the two sensor terminals.

Also for the embodiments with the anti-serial connection, a current consumption of the Hall sensor is reduced while at the same time a noise performance is improved.

In a further embodiment the Hall sensor comprises at least four Hall sensing elements, which are interconnected in a mesh having more than one dimension. For example, the mesh comprises at least two Hall sensing elements in each direction. The Hall sensing elements are distributed into two halves, as described above. Hence, half the number of Hall sensing elements are interconnected in one part of the mesh, the other half of the number of Hall sensing elements is interconnected in the other part of the mesh, while both parts of the mesh are also interconnected.

By the used mesh structure, a two-dimensional or more-dimensional interconnection of Hall sensing elements is achieved. Additionally, by the mesh structure, an array-like interconnection is formed. In other words, at least one plane is spanned by the Hall sensing elements interconnected in a mesh. In some embodiments, the single Hall sensing elements are arranged in the mesh such that one or more columns or rows respectively of the mesh overlap with neighboring columns or rows respectively, without the Hall sensing elements overlapping each other necessarily. For example, the Hall sensing elements are interconnected in a honeycomb-like mesh structure. For example, a plurality of the Hall sensing elements is arranged in an N×M mesh or array respectively, wherein N>1 and M>1. N and M may be identical or different. For example, N and M may be an exponential number to base 2. The mesh is, for example, a 4×4, an 8×8, a 16×16 or an even greater mesh with a corresponding number of Hall sensing elements. The higher number of Hall sensing elements allows to further reduce the offset voltage or the residual offset voltage, respectively. The mesh does not need to be filled completely, such that individual nodes of the mesh can remain free. Accordingly, mesh connections can be formed which have forms other than a rectangular shape, such as a round or cross-shaped form or a polygonal shape. By wiring the Hall sensing elements in the mesh, a two-dimensional or multi-dimensional interconnection can be achieved.

For example, the Hall sensing elements of the one half of the mesh are interconnected in a defined pattern, resulting in a positive contribution to the difference value to be provided at the sensor terminals. Accordingly, in one embodiment, the Hall sensing elements of the other half of the mesh are interconnected in a symmetrical fashion with respect to the Hall sensing elements of the first half.

Accordingly, the Hall sensing elements of the one half are connected in a symmetrical fashion, in particular a mirror fashion, with respect to the Hall sensing elements of the other half.

In all of the above-described embodiments, it is preferable to provide a certain symmetry, in particular a mirror symmetry to the Hall sensing elements or the interconnection of the Hall sensing elements, respectively. By applying the symmetry to the Hall sensing elements of the Hall sensor, positive and negative contributions to the desired difference value can be easily achieved. By applying the direct interconnection of the Hall sensing elements within the Hall sensor, the complexity of the Hall sensor or a resulting sensor application, can be reduced compared to the conventional application of separate Hall sensors, each needing a separate supply circuit and a separate amplification circuit. Furthermore, power consumption is reduced to achieve a desired noise level.

Hence, according to a further embodiment, a sensor arrangement comprises a Hall sensor according to one of the embodiments described, a bias circuit connected to the Hall sensor and an amplifier connected to the two sensor terminals of the Hall sensor, in particular the two sensor terminals providing the difference value for generating an amplified difference signal on the basis of the difference value formed between the two sensor terminals. For example, a supply signal is provided to the Hall sensor by the bias circuit.

Accordingly, only a single bias circuit and a single amplifier is needed for an application where a difference value is measured corresponding to the difference of magnetic field intensities at two positions.

Figure 3:
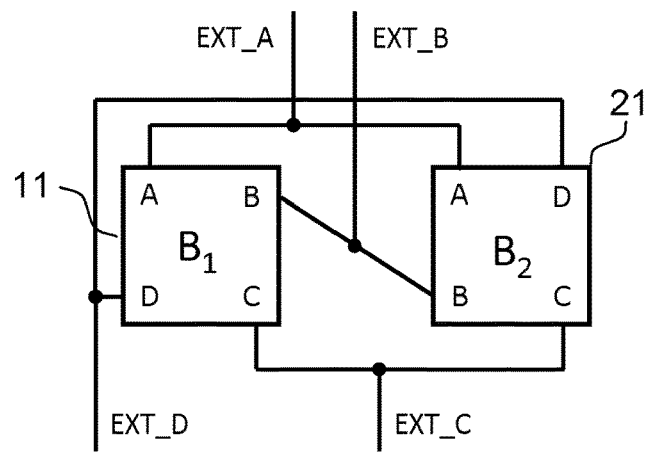
Figure 4:
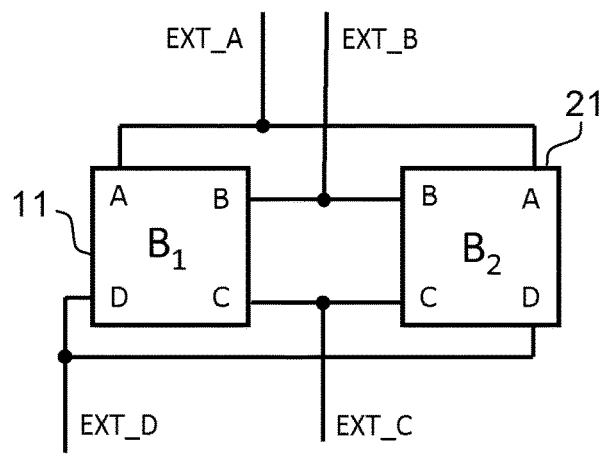
Figure 5:
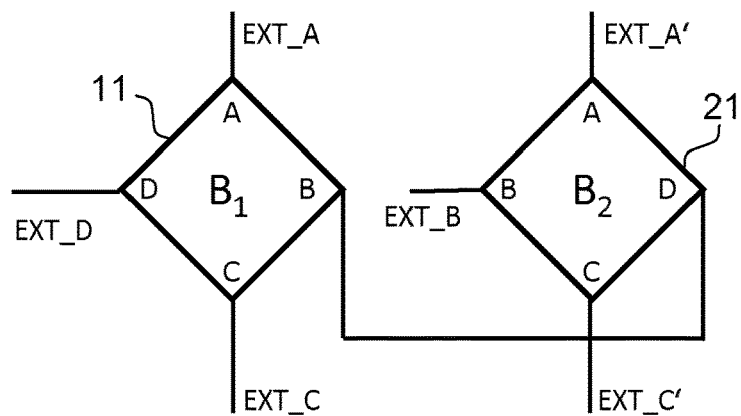
Figure 6:
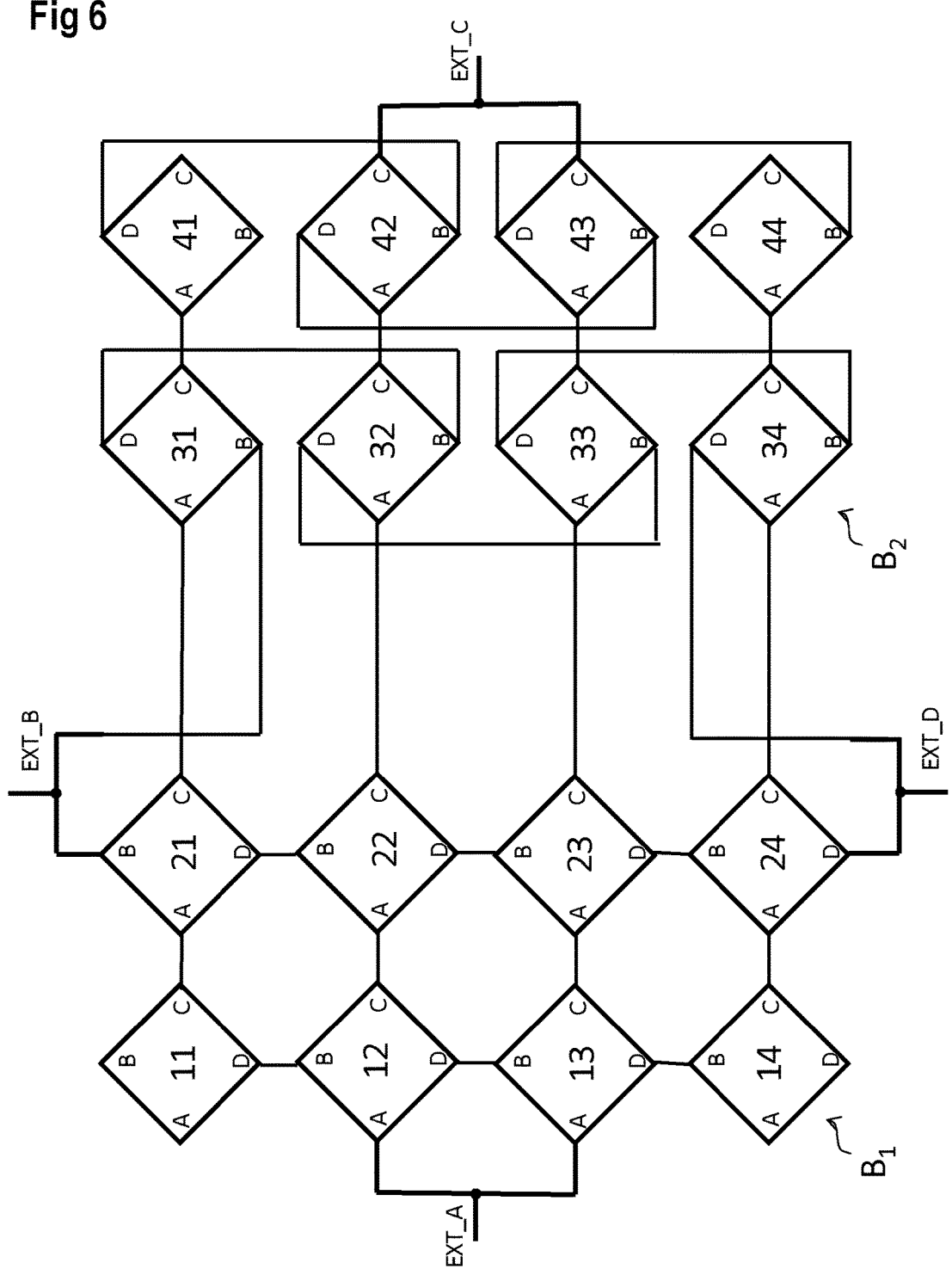
Figure 7:
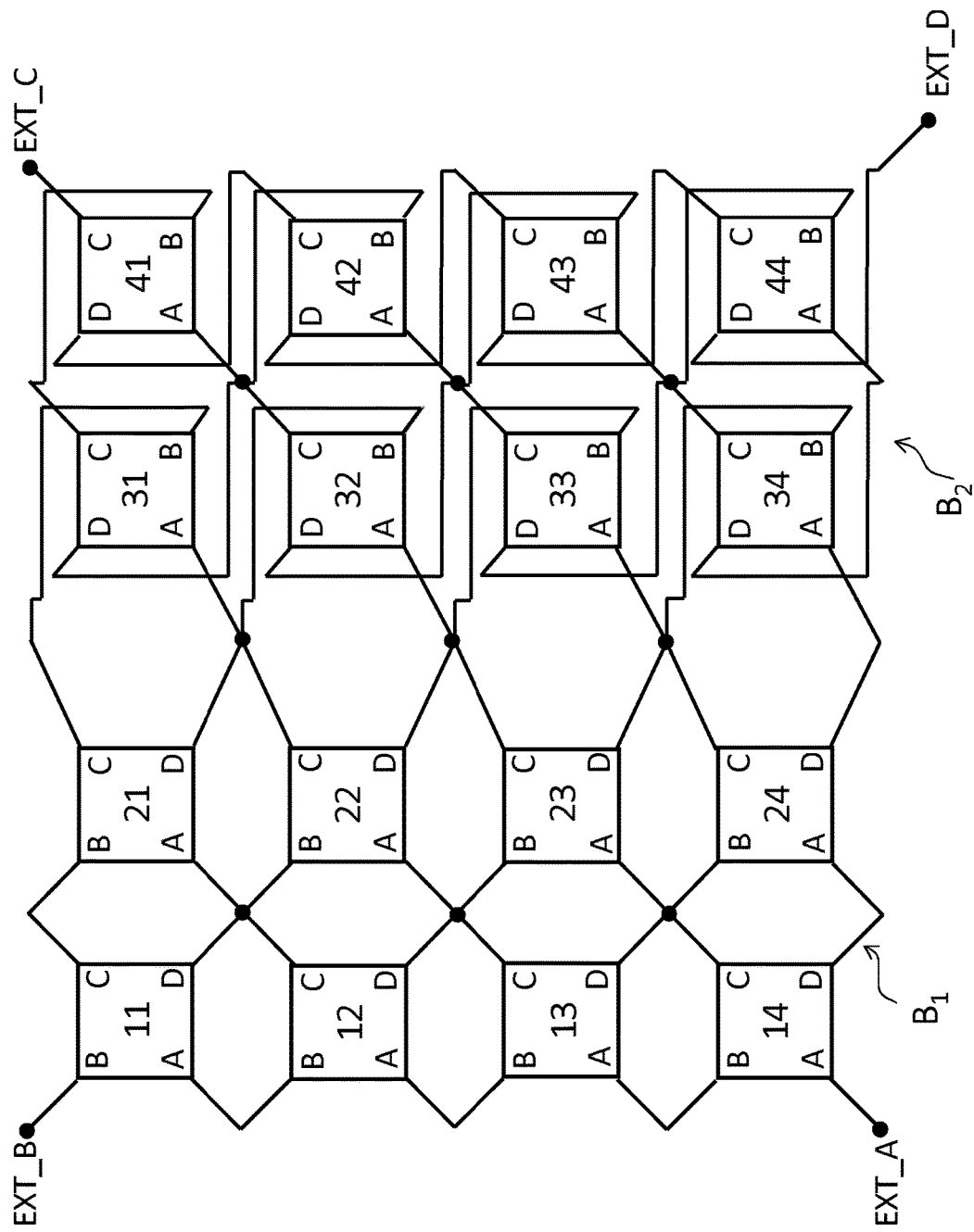
Figure 8A:
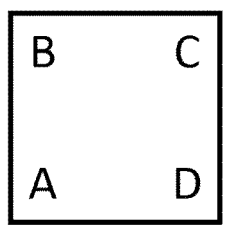
Figure 8E:
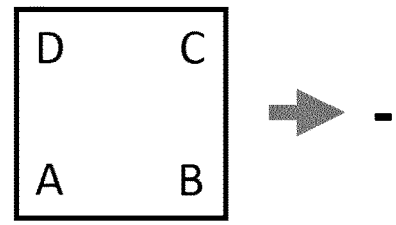
Figure 8B:
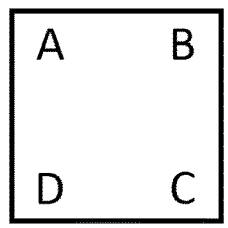
Figure 8F:
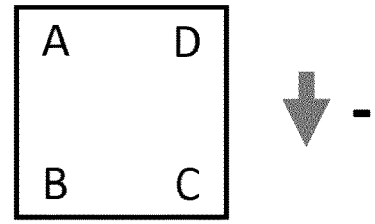
Figure 8C:
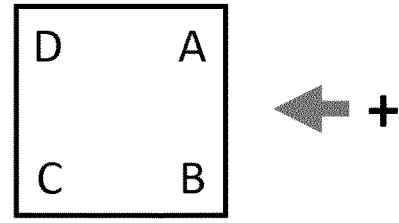
Figure 8G:
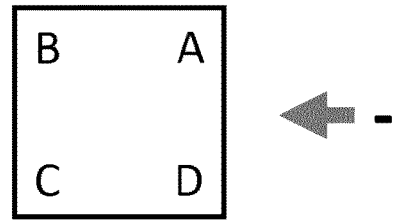
Figure 8D:
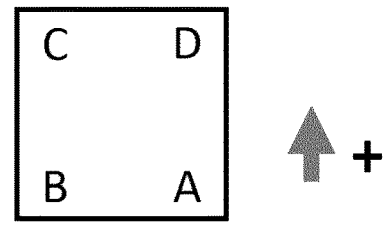
Figure 8H:
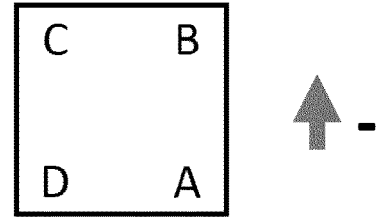
Figure 9:
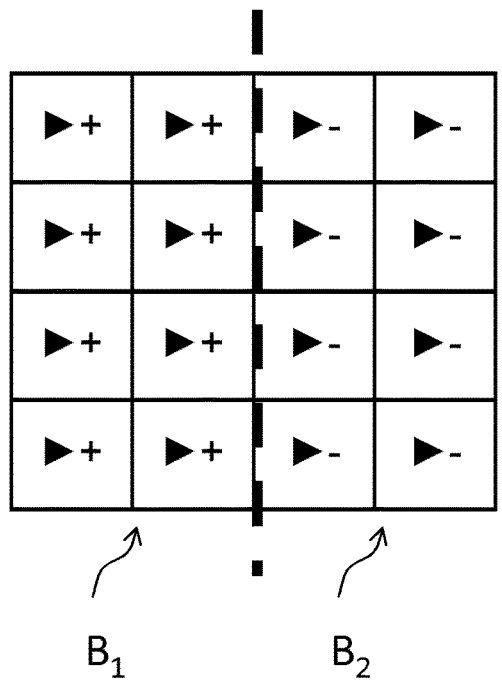
Figure 10:
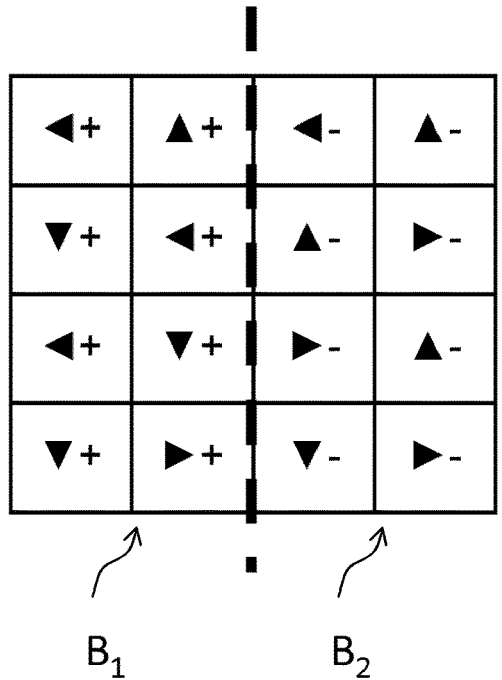

The text below explains the invention in detail using exemplary embodiments with reference to the drawings. Same references are used for same elements or elements having a similar function in the various figures. In the drawings:

FIG. 1: shows an embodiment of a sensor arrangement comprising a Hall sensor,

FIG. 2: shows embodiments of a Hall sensing element,

FIG. 3: shows an embodiment of a Hall sensor with two Hall sensing elements,

FIG. 4: shows a further embodiment of a Hall sensor with two Hall sensing elements, FIG. 5: shows a further embodiment of a Hall sensor with two Hall sensing elements, FIG. 6: shows an embodiment of a Hall sensor with a plurality of Hall sensing elements, FIG. 7: shows a further embodiment of a Hall sensor with a plurality of Hall sensing elements, FIG. 8: shows various embodiments of a Hall sensing element, FIG. 9: shows a further embodiment of a Hall sensor with a plurality of Hall sensing elements, FIG. 10: shows a further embodiment of a Hall sensor with a plurality of Hall sensing elements, FIG. 11: shows a further embodiment of a Hall sensor with a plurality of Hall sensing elements, and FIG. 12: shows a further embodiment of a Hall sensor with a plurality of Hall sensing elements.

In a conventional approach for determining a difference value corresponding the difference of magnetic field intensities at difference locations, for each location there is provided a separate Hall sensor with a respective supply circuit and a respective amplifier, wherein the effective difference value is formed by evaluating the output signals of the two amplifiers. In the conventional approach, each Hall sensor consists of a single Hall sensing element, for example.

The input related thermal noise $B_{Noise\text{-}sensor}$ for a certain bandwidth $\Delta f$ of a Hall sensor or Hall sensing element with the resistance $R_H$ is:

$$B_{Noise\text{-}Sensor} = \frac{\sqrt{4kT \cdot \Delta f \cdot R_H}}{S_0},$$

where the sensitivity at a certain operating point $S_0$ is determined by the supply voltage $V_{IN}$ or supply current $I_{IN}$ of the Hall sensor and the voltage or current related sensitivity $S_V$ or $S_I$:

$$S_0 = V_{IN} \cdot S_V = I_{IN} \cdot S_I$$

The input related noise $B_{Noise\text{-}FE}$ of an amplifier for amplifying the output signal of the Hall sensor can be approximated by the following equation:

$$B_{Noise\text{-}FE} = \frac{\sqrt{4kT \cdot \Delta f \cdot R_{FE}(I_{FE})}}{S_0},$$

where $I_{FE}$ is the current provided to the amplifier and $R_{FE}(I_{FE})$ is the equivalent noise resistance depending on $I_{FE}$.

Thus the total input related noise $B_{Noise}$ of the Hall sensor and the amplification results to:

$$B_{Noise} = \frac{\sqrt{4kT \cdot \Delta f(R_H + R_{FE}(I_{FE}))}}{S_0}$$

For measuring the difference of the magnetic field, two Hall sensors with amplification are required in a conventional approach. Hence, resulting from a geometrical addition, the noise $B_{Noise-total}$ of the complete system is:

$$B_{Noise-total} = \frac{\sqrt{2}}{2}\frac{\sqrt{4kT \cdot \Delta f(R_H + R_{FE}(I_{FE}))}}{S_0}$$

With $I_H$ being the supply current for the Hall sensor, the total current $I_{tot}$ required is:

$$I_{tot} = 2 \cdot I_H + 2 \cdot I_{FE}$$

FIG. 1 shows a sensor arrangement with a Hall sensor HS, a supply circuit or bias circuit BIAS, a switching network SWN and an amplifier AMP. The Hall sensor HS comprises at least two Hall sensing elements, of which at least one Hall sensing element is located in a first half $B_1$ of Hall sensing elements, an at least one Hall sensing element is located in a second half $B_2$ of the Hall sensing elements. First half $B_1$ and second half $B_2$ are connected together with various connections connecting element terminals of the Hall sensing elements of the Hall sensor HS.

Some of the internal connections of the Hall sensor HS are connected to the outside via external connections or sensor terminals EXT_A, EXT_B, EXT_C and EXT_D. These sensor terminals are used for operating the Hall sensor HS. To this end, the Hall sensor HS is connected to the bias circuit BIAS and to the amplifier AMP via the switching network SWN. The switching network SWN is optional and, for example, serves the purpose to perform offset reduction techniques as the current spinning technique known in the art. However, if such techniques are not used in various embodiments, the switching network SWN can be omitted such that the bias circuit BIAS and the amplifier AMP are connected directly to the Hall sensor HS or the sensor terminals EXT_A, EXT_B, EXT_C and EXT_D, respectively.

Each of the Hall sensing elements is configured to provide an individual sensor value between two of its element terminals, wherein the individual sensor values correspond to a magnetic field of the same orientation. The at least two Hall sensing elements comprised by the two halves $B_1$, $B_2$ are internally connected such that a difference value is electrically formed between two of the sensor terminals EXT_A, EXT_B, EXT_C and EXT_D resulting from the respective individual sensor values. Hence, the difference value is provided to the amplifier AMP in order to generate an amplified difference signal SB12 on the basis of the difference value. The difference value is proportional to the difference of magnetic fields between the two locations of the first and the second half $B_1$, $B_2$ respectively.

Hence, only a single supply circuit in a single amplifier is necessary for operating the Hall sensor and generating the difference signal SB12, compared to two supply circuits and two amplifiers necessary in the conventional approach described above. Therefore, an input-related noise and a current consumption of the embodiment of FIG. 1 outperform the conventional approach, which will be explained in more detail later with respect to various embodiments of the Hall sensor HS, which can be used within the sensor arrangement of FIG. 1. Furthermore, if the Hall sensor HS and the other circuit paths BIAS, SWN, ANP are implemented on a semiconductor body, less area is required compared to the conventional approach.

Figure 2A:
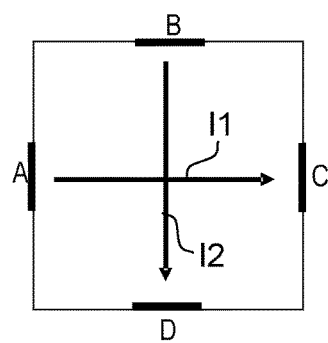

The Hall sensing elements of the Hall sensor HS can be constructed in various forms of per se known implementations. In FIG. 2 exemplary embodiments of Hall sensing elements are shown with possible directions of current flow during operation. Herein, FIG. 2A shows an embodiment of a lateral Hall sensing element, wherein in one operating phase of, for example, the spinning current technique, a current I1 flows form element terminal A to an element terminal C, while in another operating phase a current I2 flows from element terminal B to an element terminal D. For example, centered on the sides of the Hall sensing element, which is shown as a square, electrical contacts are provided serving as element connections A, B, C, D. With such a lateral Hall sensing element, a magnetic field can be measured which is perpendicular to the surface of the element shown as a square.

Figure 2B:
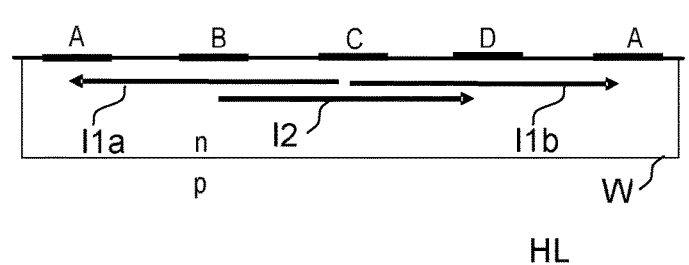

FIG. 2B illustrates an embodiment of a vertical Hall sensing element, for which for example an n-doped well W is provided within a p-doped semiconductor body HL. On the surface of the semiconductor body HL and the well W, respectively, contact pads for the element terminals A, B, C, D are provided, wherein the contact pad for the element terminal A is executed twice or symmetrically, respectively.

In analogy to the Hall sensing element shown in FIG. 2A, a current flows within the vertical Hall sensing element of FIG. 2B in a first operating phase from the element terminal C to the contact pads of the element terminal A, characterized by the flow arrows I1A, I1B. In a second operating phase, a current I2 flows from element terminal B to element terminal D in an analog way. With the Hall sensing element shown in FIG. 2B, a magnetic field being parallel to the surface of the semiconductor body HL or the well W can be measured. In particular, a measurement is performed of a magnetic field, which figuratively, runs vertical in the illustration of FIG. 2B.

Preferably, when applied to the Hall sensor HS of FIG. 1, all Hall sensing elements are constructed from the same type, namely all vertical Hall sensing elements or all lateral Hall sensing elements. Furthermore, all the Hall sensing elements of the Hall sensor HS are constructed congenerously, for example having the same dimensions and the same electrical parameters.

For the specific implementation of the Hall sensor HS, there are various implementations, of which some will be explained in more detail in conjunction with the following figures.

For example, FIG. 3 shows an embodiment of a Hall sensor HS with two Hall sensing elements 11, 21, which are connected in an anti-parallel fashion. Each of the Hall sensing elements 11, 12 comprises four element terminals A, B, C, D which are connected to sensor terminals EXT_A, EXT_B, EXT_C and EXT_D. The Hall sensing element 11 forms a first half $B_1$ of the Hall sensing elements, while the Hall sensing element 21 forms a second half $B_2$ of the Hall sensing elements.

The Hall sensing elements 11, 21 are arranged symmetrically to each other, in particular with a mirror symmetry. In this respect, the element terminals of the Hall sensing element 11 are labeled clockwise, starting with element terminal A in the upper left corner and ending with element terminal D in the lower left corner. Due to the symmetry, the element terminals of the Hall sensing element 21 are labeled counterclockwise, starting again with element terminal A at the upper left corner but ending with element terminal D at the upper right corner. Hence, by connecting the respective element terminals A to the sensor terminal EXT_A, the element terminals B to the sensor terminal EXT_B, the element terminals C to the sensor terminal EXT_C and the element terminals D to the sensor terminal EXT_D, a difference is implicitly formed between two opposite sensor terminals. For example, this becomes apparent when looking at element terminals B and D, which are switched between the Hall sensing elements 11, 21.

FIG. 4 shows another embodiment of a Hall sensor HS with two Hall sensing elements 11, 21 connected in an anti-parallel, similar to the embodiment shown in FIG. 3. However, in the embodiment of FIG. 4, the right Hall sensing element 21 is rotated by 90° clockwise with respect to the counterpart shown in FIG. 3. Hence, a geometrical spinning is applied to the Hall sensing element 21. Therefore, a residual offset of the resulting Hall sensor is improved.

In both embodiments of FIG. 3 and FIG. 4, the Hall sensing elements 11, 21 are connected such that the Hall sensing element 11 provides a contribution to the resulting difference value with an opposite sign compared to the contribution of the Hall sensing element 21. Therefore, the difference value is proportional to the difference of magnetic fields between the two locations of the first and the second half $B_1$, $B_2$ respectively.

In the following the performance of the Hall sensor shown in FIGS. 3 and 4 is compared to the conventional approach described above.

For example, the input related noise $B_{Noise}$ of the embodiments of FIG. 3 and FIG. 4 is given by $$B_{Noise} = \frac{\sqrt{4kT \cdot \Delta f \left( \frac{R_H}{2} + R_{FE}(I_{FE}) \right)}}{S_0}$$

and the total current $I_{tot}$ is $$I_{tot} = 2 \cdot I_H + I_{FE}.$$

The effective resistance of the Hall sensor in the equation above results from the parallel connection of the two Hall sensing elements 11, 21, thus halving the individual resistance $R_H$ of each Hall sensing element. While the input related noise $B_{Noise}$ from the Hall sensor is identical to the conventional approach, the contribution of the amplification is increased, namely $S_0$ versus $2*S_0$. In order to have the same noise as in the conventional approach for the reason of a better comparison, the Hall sensor supply current or voltage can be increased by $\sqrt{2}$ and the Hall sensing element resistance $R_H$ can be doubled. Then the input related noise $B_{Noise}$ is $$B_{Noise} = \frac{\sqrt{4kT \cdot \Delta f \left( \frac{2 \cdot R_H}{2} + R_{FE}(I_{FE}) \right)}}{\sqrt{2} \cdot S_0}$$

and the total current $I_{tot}$ is $$I_{tot} = \sqrt{2} \cdot I_H + I_{FE}.$$

Hence with the described embodiments of FIG. 3 and FIG. 4 an equal noise performance with less current consumption is achieved in this operating point, outperforming the conventional approach.

FIG. 5 shows another embodiment of a Hall sensor with two Hall sensing elements 11, 21. In this embodiment the Hall sensing elements 11, 21 are connected in an anti-serial fashion. Similar to the embodiments of FIG. 3 and FIG. 4, the element terminals of the Hall sensing elements 11, 21 are labeled clockwise and counterclockwise respectively in order to provide a symmetry between the first Hall sensing element 11, forming a first half $B_1$ of the Hall sensing elements, and the second Hall sensing element 21, forming a second half $B_2$ of the Hall sensing elements.

In this embodiment the element terminals A, C are connected to sensor terminals EXT_A, EXT_A', EXT_C, EXT_C', respectively. For example, a supply signal, in particular a supply current, can be provided to the Hall sensing elements 11, 21 via these sensor terminals. The element terminal B of Hall sensing element 11 is connected to element terminal D of Hall sensing element 21. Element terminal D of Hall sensing element 11 is connected to the sensor terminal EXT_D, and element terminal B of Hall sensing element 21 is connected to sensor terminal EXT_B. As can be seen from FIG. 5, the anti-serial connection is particularly formed between the sensor terminals EXT_B, EXT_D. Hence, the resulting difference value between the sensor terminals EXT_B, EXT_D, corresponds to the difference of the magnetic field intensities between the locations of the Hall sensing elements 11, 21.

Thus, any homogenous unidirectional magnetic field is cancelled such that the resulting Hall sensor HS is only sensitive to a difference in the magnetic field to be measured, for example generated by a moving magnet or a current through a coil.

The connection between the sensor terminals EXT_A, EXT_A', EXT_B, EXT_C, EXT_C', EXT_D may be fixed. In order to be able to perform techniques like current spinning, the interconnections between the sensor terminals EXT_A, EXT_A', EXT_B, EXT_C, EXT_C', EXT_D may be variable. For example, the element terminals A, B, C, D of the Hall sensing elements 11, 12 are configured to be used as signal terminals or as supply terminals. The Hall sensor may further comprise a switching network, which is configured to vary connections of the supply terminals to the respective sensor terminals EXT_A, EXT_A', EXT_C, EXT_C' in consecutive operating phases and to vary connections of the signal terminals between the sensor terminals EXT_B, EXT_D in the consecutive operating phases, such that the difference value is electrically formed between the two sensor terminals EXT_B, EXT_D. For example, the element terminals to be connected are rotated between the different operating phases.

Further specific implementations for the anti-serial embodiment are possible, for example with a greater number of Hall sensing elements than shown in FIG. 5 or with implementations of current sources etc. In particular, the switching technique described in German patent application 10 2011 017096 for a Hall sensor semiconductor device with serially connected Hall sensors, the disclosure of which in incorporated in its entirety by reference, can be adapted to the anti-serial Hall sensor by a skilled person.

For example, the input related noise $B_{Noise}$ of the embodiment of FIG. 5 is given by $$B_{Noise} = \frac{\sqrt{4kT \cdot \Delta f(2 \cdot R_H + R_{FE}(I_{FE}))}}{2 \cdot S_0}$$

and the total current $I_{tot}$ is $$I_{tot} = 2 \cdot I_H + I_{FE}.$$

Hence with the described embodiment of FIG. 5 a better noise performance with less current consumption is achieved compared to the conventional approach.

FIG. 6 shows a further embodiment of a Hall sensor HS with a plurality of Hall sensing elements arranged in a first half $B_1$ and a second half $B_2$. In particular, the first half $B_1$ comprises Hall sensing elements 11, 12, 13, 14, 21, 22, 23, 24 and the second half $B_2$ comprises Hall sensing elements 31, 32, 33, 34, 41, 42, 43, 44. The Hall sensing elements 11, 12, ..., 24 of the first half $B_1$ are connected such that they contribute a value of one polarity corresponding to the magnetic field intensity in the area or shape of the first half $B_1$. Similarly, the Hall sensing elements 31, 32, ..., 44 contribute a value of an opposite polarity corresponding to magnetic field intensity in the area or shape of the second half $B_2$. Furthermore, first and second halves, or the Hall sensing elements of the first and the second half $B_1$, $B_2$ respectively, are connected such that the two contributions form a difference value between two of the external sensor terminals EXT_A, EXT_B, EXT_C and EXT_D corresponding to a difference of the magnetic field intensities at two halves $B_1$, $B_2$. For example, the first and the second half $B_1$, $B_2$ form a first contiguous area and a second contiguous area, which have a similar shape and are arranged spaced apart. The first and the second half $B_1$, $B_2$ can have forms other than a rectangular shape, such as a round or cross-shaped form or a polygonal shape.

For generating the difference value, the element terminals A of Hall sensing elements 12, 13 are connected to the sensor terminal EXT_A, the element terminals B of Hall sensing elements 21, 31 are connected to sensor terminal EXT_B, the element terminals C of Hall sensing elements 42, 43 are connected to sensor terminal EXT_C and the element terminals D of Hall sensing elements 24, 34 are connected to sensor terminal EXT_D. Furthermore, the element terminal C of Hall sensing elements 11, ..., 34 are connected to the element terminal A of their respective right neighbor, namely Hall sensing elements 21, ..., 44. In a similar fashion element terminals D of the Hall sensing elements of the upper three rows are connected to element terminals B of their neighbor, namely the Hall sensing elements in the lower three rows.

Similar to the embodiments of FIG. 3, FIG. 4 and FIG. 5, the element terminals of the Hall sensing elements of the first half $B_1$ are labeled clockwise, while the element terminals of the Hall sensing elements of the second half $B_2$ are labeled counterclockwise. Hence, the Hall sensing elements of the second half $B_2$ are arranged symmetrically with respect to the Hall sensing elements of the first half $B_1$.

The arrangement of the Hall sensing elements in the embodiment of FIG. 6 reduces a residual offset of the resulting Hall sensor due to the proposed connections.

The Hall sensing elements 11, 12, ..., 44 form a two-dimensional mesh within the Hall sensor HS, wherein the mesh is contacted only via the sensor terminals EXT_A, EXT_B, EXT_C, EXT_D.

FIG. 7 shows another embodiment of a Hall sensor comprising a plurality of Hall sensing elements 11, 12, ..., 44 being connected in a mesh. Compared to the embodiment of FIG. 6, the Hall sensing elements of FIG. 7 are rotated by 45°. Furthermore, some of the Hall sensing elements are connected to neighboring Hall sensing elements such that two or four element terminals A, B, C, D are connected together. For example, element terminal A of Hall sensing element 21 is connected to element terminal B of its lower neighbor, Hall sensing element 22, to element terminal C of lower left neighbor, Hall sensing element 12, and to element terminal D of left neighbor, Hall sensing element 11. A similar connection is also present for Hall sensing elements 22, 23, 31, 32, 33, 41, 42, 43 and their respective left, lower left and lower neighbors.

As in the previous embodiments, the element terminals of the Hall sensing elements of the first half $B_1$ are labeled clockwise while the element terminals of the Hall sensing elements of the second half $B_2$ are labeled counterclockwise, each starting in the lower left corner with element terminal A. Hence, also the arrangement of FIG. 7 has symmetry.

Hall sensing elements at the edges of the arrangement are only connected to their neighbor. The Hall sensor shown in FIG. 7 is connected via sensor terminal EXT_A being connected to element terminal A of Hall sensing element 14, sensor terminal EXT_B connected to element terminal B of Hall sensing element 11, sensor terminal EXT_C connected to element terminal C of Hall sensing element 41, and sensor terminal EXT_D connected to element terminal D of Hall sensing element 44.

Similar to the embodiment of FIG. 6, a difference value can be measured between two of the sensor terminals corresponding to the difference of magnetic fields at the locations of the first and the second half $B_1$, $B_2$.

For example, the input related noise $B_{Noise}$ of the embodiments having a mesh configuration is given by $$B_{Noise} = \frac{\sqrt{4kT \cdot \Delta f(R_H + R_{FE}(I_{FE}))}}{S_0}$$

and the total current $I_{tot}$ is $$I_{tot} = I_H + I_{FE}.$$

In the equation above, the resistance $R_H$ is the effective resistance of the connected Hall sensing elements appearing at the sensor terminals. Thus with half the current compared to the conventional approach the noise is increased by a factor of $\sqrt{2}$. In order to get the same noise as in the conventional approach, the supply current or supply voltage can be increased by a factor of $\sqrt{2}$. Then the total current $I_{tot}$ is $$I_{tot} = \sqrt{2} \cdot I_H + I_{FE},$$

which is still lower compared to the conventional approach.

FIG. 8 shows various possible configurations for Hall sensing elements, which differ mainly by their labeling of the respective element terminals. For example, the configurations of FIG. 8A, FIG. 8B, FIG. 8C and FIG. 8D show configurations where the element terminals are labeled clockwise, denoted by the plus sign next to a respective arrow. Similarly, FIG. 8E, FIG. 8F, FIG. 8G and FIG. 8H show configurations where the labeling of the element terminals is performed counterclockwise, denoted by the minus sign next to the respective arrow.

The direction of the arrow indicates which corner of the Hall sensing element is labeled with a reference element terminal, for example element terminal A. In particular, a right-pointing arrow, as used in FIG. 8A and FIG. 8E, denotes that the lower left corner is labeled with the element terminal A. A down-pointing arrow denotes that the upper left corner is labeled with the element terminal A, as shown in FIG. 8B and FIG. 8F. A left-pointing arrow denotes a labeling of the upper right corner with element terminal A, as denoted in FIG. 8C and FIG. 8G. Finally, an up-pointing arrow denotes that the element terminal A is positioned in the lower right corner. The various configurations can be used within a Hall sensor according to one of the embodiments described above. For example, the configurations of FIG. 8A, FIG. 8B, FIG. 8C, FIG. 8C, having a clockwise labeling, are used in the first half $B_1$ and the configurations of FIG. 8E, FIG. 8F, FIG. 8G and FIG. 8H, having a counterclockwise labeling, are used in the second half $B_2$ of the Hall sensor, as described above.

Further embodiments of a Hall sensor are shown in the following figures, using respective configurations shown in FIG. 8. The respective configurations are drawn as respective arrows with a plus sign or a minus sign, respectively.

For example, FIG. 9 shows an embodiment of a Hall sensor where eight Hall sensing elements are provided in the left half $B_1$ according to the configuration of FIG. 8A. In the right half $B_2$ of the Hall sensor a symmetrical arrangement with respect to the left half $B_1$ is provided. The symmetry results from the application of the configuration of FIG. 8E for the Hall sensing elements of the right half $B_2$. The interconnection between the individual Hall sensing elements is performed similar to FIG. 6 or FIG. 7, for example. Also the provision of the sensor terminals EXT_A, EXT_B, EXT_C, EXT_D can be performed to one of the embodiments of FIG. 6 or FIG. 7, for example.

In the embodiment of FIG. 9, the used Hall sensing elements basically have the same orientation. FIG. 10 shows a further embodiment of a Hall sensor similar to the embodiment of FIG. 9, wherein the individual Hall sensing elements are rotated with respect to each other, which can be seen at the arrows pointing in different directions. However, as the Hall sensing elements at the left side $B_1$ are labeled clockwise, denoted by the plus sign, and the Hall sensing elements of the right side $B_2$ are labeled counterclockwise, denoted by the minus sign, symmetry between the two halves $B_1$, $B_2$ is provided or kept respectively. Hence, due to the symmetry, in the above-described embodiments, the difference value at the sensor terminals is provided.

Figures 11, 12:
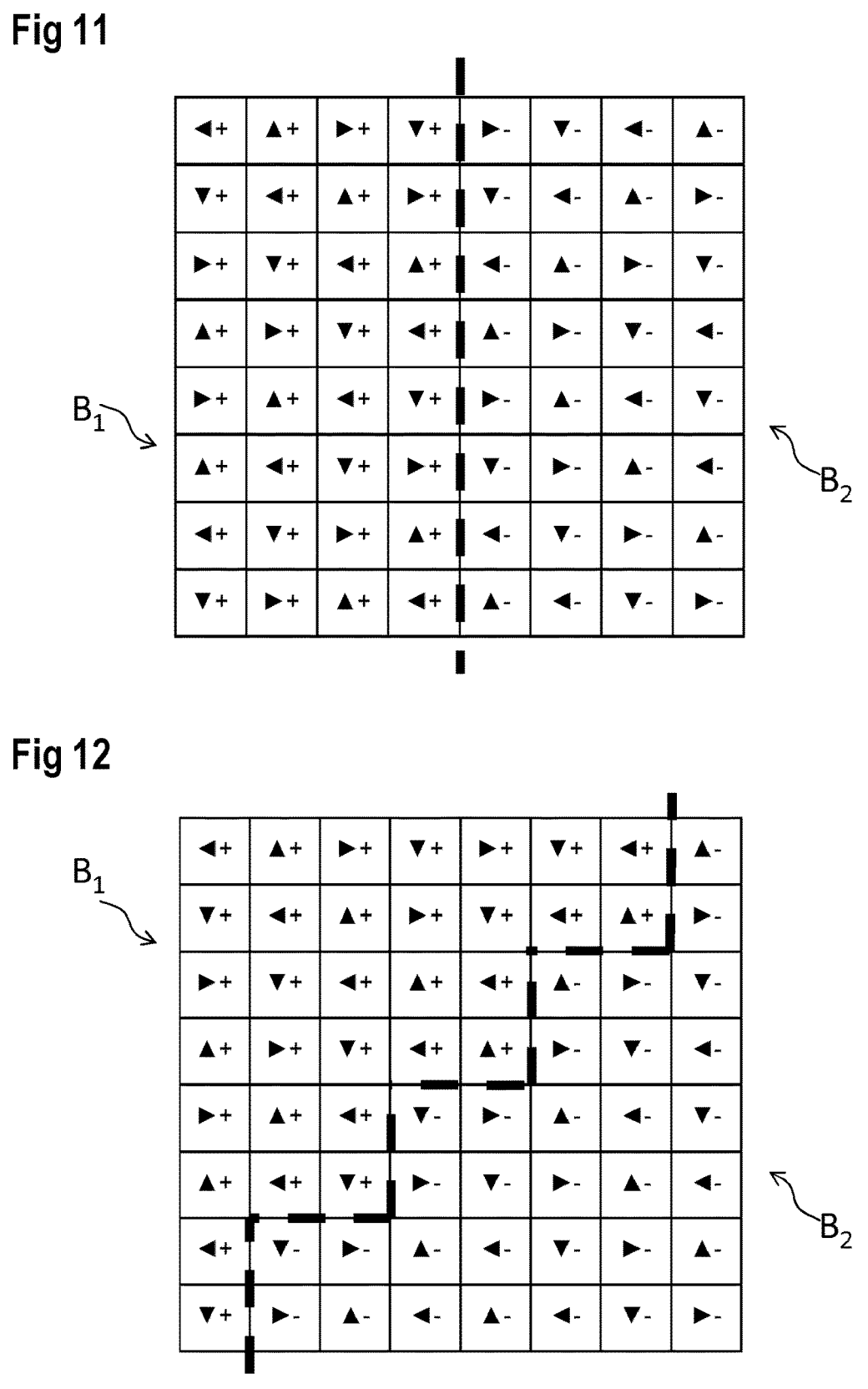

FIG. 11 shows a further embodiment of a Hall sensor, which differs from the embodiment of FIG. 10 inter alia by the number of used Hall sensing elements. In particular, the Hall sensor of FIG. 11 comprises 64 Hall sensing elements distributed to the two halves $B_1$, $B_2$. Similar to the embodiment of FIG. 10, the individual Hall sensing elements are rotated with respect to each other.

FIG. 12 shows a further embodiment of a Hall sensor with 64 Hall sensing elements. A line of symmetry separates a Hall sensor basically along a diagonal of the arrangement. However, similar to the previous embodiments, the first half $B_1$ comprises Hall sensing elements labeled clockwise, while the second half $B_2$ comprises Hall sensing elements labeled counterclockwise, denoted by the respective plus or minus sign. Hence, also in this embodiment a difference value corresponding to a difference in the magnetic field intensity at the two locations of the first and the second half $B_1$, $B_2$ can be provided by the Hall sensor of FIG. 12.

When applying the Hall sensors of the embodiments described above to the sensor arrangement of FIG. 1, only a single amplifier and a single supply circuit or bias circuit are needed for operating the Hall sensor. Also, if a chopping or dechopping mechanism is used for evaluating the signals of the Hall sensor, only a single chopping/dechopping circuit is necessary for the sensor arrangement. Hence, compared to a conventional approach, less circuit parts are necessary and the power consumption is reduced.

The embodiments of FIG. 3 and FIG. 4, showing anti-parallel configurations and the embodiments of FIG. 6, FIG. 7, FIG. 9 to FIG. 12 can be directly operated like a conventional Hall sensor, as two of the sensor terminals are used for providing a supply signal and two other of the sensor terminals are used for providing the difference value. Hence, techniques like current spinning can be applied without modification, compared to a conventional Hall sensor.

However, also the anti-serial configuration of the embodiment of FIG. 5 can be operated with a current spinning technique by respective alternation of the supply currents, as indicated above.

With the mesh-like configurations of the Hall sensor a resistance of the resulting Hall sensor can be changed or influenced, for example by choosing the number and the positions of the element terminals which are connected to the sensor terminals. In particular, the resistance of the Hall sensor can be reduced by increasing the number of Hall sensing elements being directly connected to the sensor terminals.

The invention claimed is:

1. A Hall sensor comprising at least two Hall sensing elements connected together via element terminals and at least six sensor terminals for connecting to the Hall sensor and the at least two Hall sensing elements,
   wherein
      each of the Hall sensing elements is configured to provide an individual sensor value between two of its element terminals;
      the at least two Hall sensing elements are physically and geometrically distributed basically equally into two halves and are connected such that a difference value is electrically formed between a first distinct pair of the sensor terminals resulting from the respective individual sensor values;
      the Hall sensing elements of one half are connected in an anti-serial fashion to the Hall sensing elements of the other half;
      the individual sensor values of the one half form a minuend of the difference value and the individual sensor values of the other half form a subtrahend of the difference value, such that the minuend and the subtrahend cancel out each other in case a homogeneous magnetic field of the same intensity and the same direction is applied to both halves;
      the element terminals of the Hall sensing elements are configured to be used as signal terminals or as supply terminals;
      a second distinct pair of the sensor terminals is configured to provide a distinct supply current to the Hall sensing elements of the one half, and a third distinct pair of the sensor terminals is configured to provide a further distinct supply current to the Hall sensing elements of the other half;
      the Hall sensor further comprises a switching network, which is configured to vary connections of the second and the third pair of sensor terminals to the respective supply terminals in consecutive operating phases and to vary connections of the first pair of sensor terminals to the respective signal terminals in the consecutive operating phases, such that the difference value is electrically formed between the first pair of sensor terminals; and the variation of the supply terminals and the signal terminals implements a current spinning technique for the Hall sensor.

2. The Hall sensor according to claim 1, wherein the at least two Hall sensing elements are of the same geometrical orientation;

said two element terminals, between which an individual sensor value is to be provided, are sensing terminals; and the Hall sensing elements of one half are connected in the anti-serial fashion to the Hall sensing elements of the other half such that the sensing terminals are connected in a serial fashion but with an opposite polarity.

3. The Hall sensor according to claim 1, wherein the Hall sensing elements of the one half are arranged in a first contiguous area of the Hall sensor and the Hall sensing elements of the other half are arranged in a second contiguous area of the Hall sensor, which is non-overlapping with the first contiguous area.

4. The Hall sensor according to claim 1, wherein all of the Hall sensing elements are constructed as lateral Hall sensing elements, in particular Hall plates.

5. The Hall sensor according to claim 1, wherein all of the Hall sensing elements are constructed as vertical Hall sensing elements.

6. The Hall sensor according to claim 1, wherein all of the Hall sensing elements are constructed congenerously.

7. The Hall sensor according to claim 1, wherein the difference value for two halves is formed coinstantaneously or simultaneously.

8. A Hall sensor comprising at least four Hall sensing elements electrically interconnected together via element terminals in a mesh having more than one dimension, and at least four sensor terminals for connecting to the Hall sensor and the at least four Hall sensing elements,
wherein
permanent electrical interconnections between the element terminals of the Hall sensing elements form the mesh having more than one dimension;

each of the Hall sensing elements is configured to provide an individual sensor value between two of its element terminals;

the at least four Hall sensing elements are distributed basically equally into two halves and are connected such that a difference value is electrically formed between two of the sensor terminals resulting from the respective individual sensor values;

the Hall sensing elements of one half are electrically interconnected in a first part of the mesh, the Hall sensing elements of the other half are electrically interconnected in a second part of the mesh, and both the first and the second part of the mesh are electrically interconnected; and the individual sensor values of the one half form a minuend of the difference value and the individual sensor values of the other half form a subtrahend of the difference value, such that the minuend and the subtrahend cancel out each other in case a homogeneous unidirectional magnetic field is applied to both halves.

9. The Hall sensor according to claim 8, wherein the Hall sensing elements of the one half are connected in a symmetrical fashion, in particular mirror fashion, with respect to the Hall sensing elements of the other half.

10. The Hall sensor according to claim 8, wherein the Hall sensing elements of the one half are connected such that they contribute a first value corresponding to the magnetic field intensity in the area of the one half;

the Hall sensing elements of the other half are connected such that they contribute a second value corresponding to the magnetic field intensity in the area of the other half; and the first value provides a contribution to the difference value with an opposite sign compared to the contribution of the second value.

11. The Hall sensor according to claim 8, wherein the Hall sensor is configured such that the interconnected Hall sensing elements can be contacted via the sensor terminals like a single Hall sensor, in particular during operation of the Hall sensor.

12. The Hall sensor according to claim 8, wherein the Hall sensing elements of the one half are arranged in a first contiguous area of the Hall sensor and the Hall sensing elements of the other half are arranged in a second contiguous area of the Hall sensor, which is non-overlapping with the first contiguous area.

13. The Hall sensor according to claim 12, wherein the first contiguous area and the second contiguous area have a similar shape and are arranged spaced apart.

14. The Hall sensor according to claim 8, wherein all of the Hall sensing elements are constructed as lateral Hall sensing elements, in particular Hall plates.

15. The Hall sensor according to claim 8, wherein all of the Hall sensing elements are constructed as vertical Hall sensing elements.

16. The Hall sensor according to claim 8, wherein all of the Hall sensing elements are constructed congenerously.

17. The Hall sensor according to claim 8, wherein the difference value for two halves is formed coinstantaneously or simultaneously.

18. A sensor arrangement comprising a Hall sensor according to claim 8, a bias circuit connected to the Hall sensor, and an amplifier connected to the two sensor terminals of the Hall sensor for generating an amplified difference signal on the basis of the difference value formed between the two sensor terminals.

19. The Hall sensor according to claim 8, wherein at least four of the Hall sensing elements of the mesh are not electrically parallel connected to any other of the Hall sensing elements of the mesh.

20. The Hall sensor of claim 8, wherein at least one element terminal of each of the Hall sensing elements is respectively not connected to one of the sensor terminals.

21. The Hall sensor of claim 20, wherein for at least two of the Hall sensing elements the at least one element terminals, which are not connected to one of the sensor terminals, are permanently connected together.

* * * * *